United States Patent [19]
Chen et al.

[11] Patent Number: 5,790,460
[45] Date of Patent: Aug. 4, 1998

[54] METHOD OF ERASING A FLASH EEPROM MEMORY

[75] Inventors: Chih-Liang Chen, Saratoga; I-Chuin Peter Chan; James C. Yu, both of San Jose; Chien-Sheng Su, Saratoga; Chao-Ven Kao, Palo Alto, all of Calif.

[73] Assignee: Eon Silicon Devices, Inc., Santa Clara, Calif.

[21] Appl. No.: 854,619

[22] Filed: May 12, 1997

[51] Int. Cl.[6] .................................................. G11C 16/00
[52] U.S. Cl. ........................... 365/185.29; 365/185.18
[58] Field of Search .......................... 365/185.29, 185.27, 365/185.28, 185.18, 185.33, 218

[56] References Cited

U.S. PATENT DOCUMENTS

| | | | |
|---|---|---|---|
| 5,243,559 | 9/1993 | Murai | 365/185.29 |
| 5,361,235 | 11/1994 | Kodama | 365/185.29 |
| 5,457,652 | 10/1995 | Brahmbhatt | 365/218 |
| 5,657,271 | 8/1997 | Mori | 365/185.29 |

*Primary Examiner*—Tan T. Nguyen
*Attorney, Agent, or Firm*—Fish & Richardson P.C.

[57] ABSTRACT

The invention is a novel erase method for erasing flash EEPROM memory devices. A memory cell of such a memory device has a first semiconductor region of one conductivity type formed in a second region of the opposite conductivity type, source and drain regions of the opposite conductivity type formed in the first semiconductor region, and a gate. The second region is formed within a substrate of the one conductivity type. The gate includes a control gate and a floating gate, which retains charge and overlies the first semiconductor region. The erase method of the invention includes the steps of: applying a first voltage of one polarity to the source region and the first and second semiconductor regions; and simultaneously applying a second voltage of the opposite polarity to the gate, whereby any charge on the floating gate tunnels through the floating gate dielectric into both the first region and the source region, thereby removing any charge retained by the floating gate.

14 Claims, 2 Drawing Sheets

5,790,460

1

METHOD OF ERASING A FLASH EEPROM MEMORY

BACKGROUND OF THE INVENTION AND PRIOR ART

A flash EEPROM memory is an electrically erasable, programmable, read-only memory device, which is a type of semiconductor non-volatile memory. Data stored in an array of flash memory cells is retained when power is turned off. The data is represented as electrons stored in a floating gate of a stacked-gate memory cell. Devices of this type are described in U.S. Pat. Nos. 4,698,787, 5,077,691, 5,313,086 and 5,521,886, all of which are incorporated herein by reference.

The memory cells of an EPROM are programmed by injecting electrons into the floating gate. To erase the memory cells, electrons are removed from the floating gate. A flash EEPROM is different from a UV-EPROM because a UV-EPROM is erased using ultraviolet light to drain the electrons from the floating gate, while a flash EEPROM is erased electrically using on-chip erase circuitry. Typically, both kinds of EPROMs are programmed in the same way, by injection of hot-electrons into the floating gate. One type of flash memory device, called a "DINOR" flash memory, reverses the programming and erase procedures, draining the electrons during programming via Fowler-Nordheim tunneling. During erase electrons are injected into the floating gate via Fowler-Nordheim tunneling.

In the prior art, many erasing schemes have been used for a stacked-gate, flash EEPROM memory. As the manufacturing process and device technology advance into the sub-micron regime, erasing techniques have evolved from the more common application of a large positive voltage to a source, to a different technique where a large negative voltage is applied to a control gate which is isolated electrically from the floating gate, while at the same time a moderate positive voltage is applied to the source. This later technique is called negative gate-to-source erase (NGSE).

FIG. 1 shows a prior art flash EEPROM memory cell which uses hot-electrons for programming and Fowler-Nordheim tunneling using a negative control gate voltage for erasing. The memory cell is fabricated on a p-type substrate 10 which is maintained at ground potential during operation. To erase the memory cell, an NGSE technique is used whereby a large negative voltage $V_G$ of about −11 V is applied to the control gate 11, which lies atop insulator 18, at the same time as a moderate positive voltage $V_s$ of about 5 V is applied to the source region, which is comprised of n+ region 12 together with n − region 15. Drain region 8 is floated during erase. The vertical electric field across floating gate silicon dioxide layer 19 located between floating-gate 14 and the source region 12, 15 causes the electrons to tunnel out of the dielectric layer 19.

There are two significant problems with this prior art erase scheme. First, the source junction 16 may need an additional, lightly-doped, n− diffused region 15 surrounding the heavily-doped n+ source region 12, as shown in FIG. 1. This additional diffused region may limit the scaling down of the memory cell into a smaller device as new processing procedures emerge. Second, some current flows from the combined source region 12 and 15 into the substrate 10 when the source junction 16 is reverse biased during erase. This current is referred to as band-to-band (BB) tunneling current. The magnitude of the BB tunneling current depends upon the magnitude of the reverse bias voltage applied to source region 12. With control gate 11 biased at a negative

2 voltage, the hole component (called "hot holes") of the BB tunneling current tends to follow the electric field and bombard semiconductordielectric interface 17 and the dielectric layer 19. These hot holes can damage this interface 17 by generating undesirable interface states. Moreover, some of these hot holes may actually have enough energy to be injected into dielectric layer 19, where they are trapped. The device can thereby be degraded. Consequently, NGSE techniques generate hole trap-ups and interface states which cause reliability problems such as window-opening, charge loss, erratic erase and accentuated gate disturb.

These interface states and trapped holes distribute themselves laterally from the source PN junction 16 shown in FIG. 1, into the respective channel region 13. The peak density and the width of this trapped hole distribution depends upon both the junction bias and the control gate bias during the erase operation. For a long channel device, the width of this hole distribution is small relative to the entire channel length, and its adverse impact on device reliability and performance is small. However, for a deep, sub-micron device, the width of this distribution becomes a significant proportion of the channel length. As such, its adverse impact upon device reliability and performance is much more significant.

Referring to FIG. 2, another prior art erasing technique is shown using a memory cell formed in a p-well 24. P-well 24, which may be contacted using p+ region 29, is formed in an n-well 25. N-well 25, which may be contacted through n+ region 36, lies within p-type substrate 23. To erase memory cell 20, a large negative voltage $V_G$ of about −11 V is applied to control-gate 21, as was done in the previous technique discussed above. Control gate 21 lies atop insulator 34 which, in turn, lies atop floating gate 28. However, at the same time, a moderate positive voltage $V_B$ of about 5 volts is applied to the p-type channel region 22 through p+ contact region 29. Typically the p-type substrate 23 is grounded as shown. The application of a positive voltage through p+ contact region 29 to p-type channel region 22 requires the formation of an isolated p-well 24 inside of n-well 25. During erase, source region 30 and drain region 31 are floated at a potential below the bias voltage of p-well 24. This potential depends upon the geometry of the source and drain regions 30 and 31 and also upon the amount of leakage current from the drain and source regions.

This second prior art erase technique is referred to as negative gate channel erase, or "NGCE", where the electrons in the floating-gate 28 tunnel vertically across floating gate dielectric 33 into the channel region 22, as shown by the vertical, downwardly pointing arrows. Since there is no electrical bias between the source region 30 and the p-well 24, and the source region 30 is floating, no BB current exists (as it does using the NGSE technique). However, when this NGCE technique is used with a stacked-gate flash memory, other device reliability problems may result. For instance, since erasing is done over the channel region 22, interface state generation and oxide trap-up are all distributed along this channel region. Such a concentration of interface states and oxide trap-up degrades the memory cell read current, which may in turn slow down the reading speed and may eventually cause read errors. Trap-up due to NGCE at the portion 35 of the oxide layer 33, which lies beneath floating gate 28 and above drain junction 27, may also retard hot electron injection during programming.

The background and associate device reliability issues with respect to these prior art erase procedures are described in the following publications: Haddad, et al., "Degradation Due to Hole Trapping in Flash Memory Cell," IEEE Electronic Device Letters, Vol. 10., No. 3, March 1989, pp. 177–119; Chun, et al., "Lateral Distribution of Erase Induced Damage in Flash EPROM Devices," SRC Techcon, September 1996; Chun, et al., "Lateral Distribution of Erase Induced Hold Trapping and Interface Traps in Flash EPROM NMOSFET Devices," IEEE Semiconductor Interface Specialists Conference, 1996; Witters, et al., "Degradation of Tunnel-Oxide Floating Gate EPROM Devices and Correlation With High-Field-Current-Induced Degradation of Thin Gate Oxides, " IEEE Transactions On Electron Devices, Vol. 36, No. 9, September 1989, p. 1663; and Kobayashi, et al., "Memory Array Architecture and Decoding Scheme for 3 V Only Sector Erasable DINOR Flash Memory," IEEE Journal of Solid-State Circuits, Vol. 29, No. 4, April 1994, pp. 454–458.

SUMMARY OF THE INVENTION

To avoid the above problems with prior art erase techniques, a novel erase method for erasing flash EEPROM memory devices has been invented. A memory cell of such a memory device has a first semiconductor region of one conductivity type formed in a second region of the opposite conductivity type, source and drain regions of the opposite conductivity type formed in the first semiconductor region, and a gate. The second region is formed within a substrate of the one conductivity type. The gate includes a floating gate, which retains charge and overlies the first semiconductor region. The floating gate is electrically isolated from the first semiconductor region and from the source and drain regions by a gate dielectric layer. A control gate lies atop the floating gate and also is electrically isolated from the floating gate by an insulating layer. The dielectric material between the floating gate and the first semiconductor region may be SiO$_2$, but the dielectric material between the floating gate and the control gate is often a composite layer, such as ONO (oxide-nitride-oxide).

The erase method of the invention includes the steps of: (1) applying a first voltage of one polarity to the source and the first and second semiconductor regions; and simultaneously applying a second voltage of the opposite polarity to the control gate, whereby any charge on the floating gate tunnels through the floating gate dielectric into both the first region and the source region, thereby removing any charge retained by the floating gate. Preferably the drain region is left floating and the substrate is grounded.

The erase method of this invention, called negative gate-to-channel-and-source erase (NGCSE), substantially reduces and for practical purposes eliminates the reliability problems caused by BB tunneling current. The method of the invention also reduces the device degradation caused by hole trap-up and interface state generation, both of which cause problems when using prior art erase techniques. NGCSE is actually faster than prior art NGCE and NGSE techniques.

DESCRIPTION OF THE PREFERRED EMBODIMENT

Figure 1:
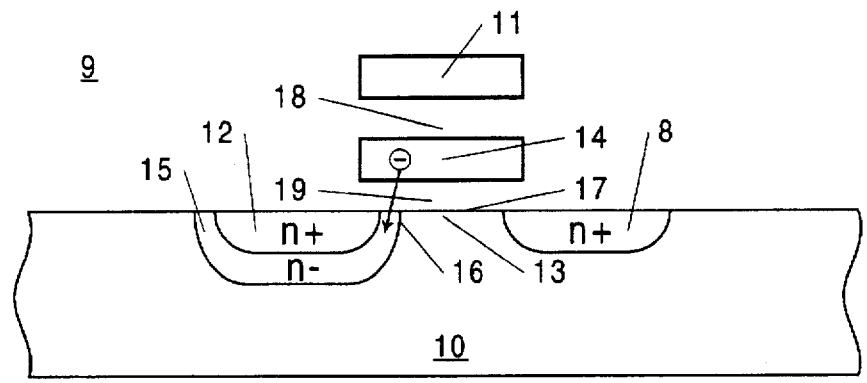
FIG. 1 is a cross-sectional view of a flash EEPROM cell in the prior art NGSE erase procedure.
Figure 2:
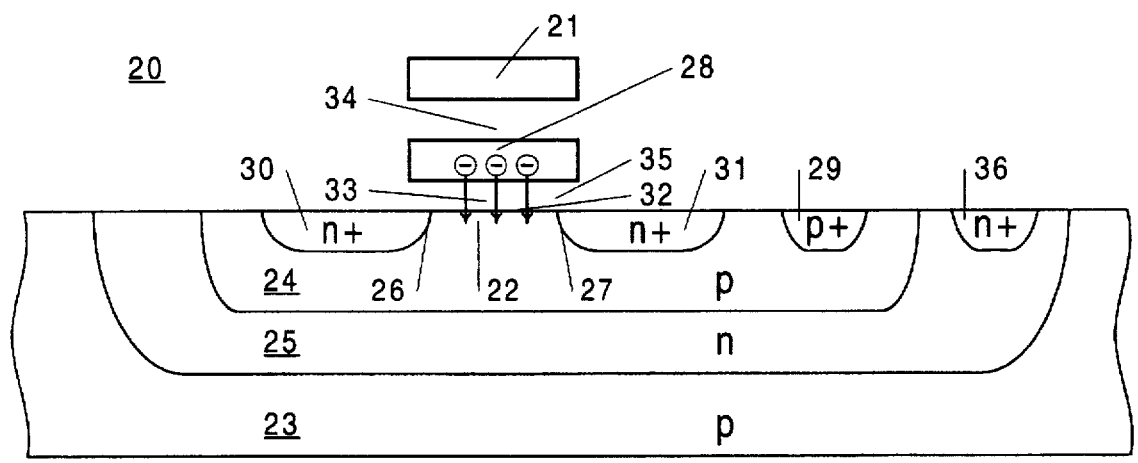
FIG. 2 is a cross-sectional view of a flash EEPROM memory cell used in the prior art NGCE erase procedure.
Figure 3:
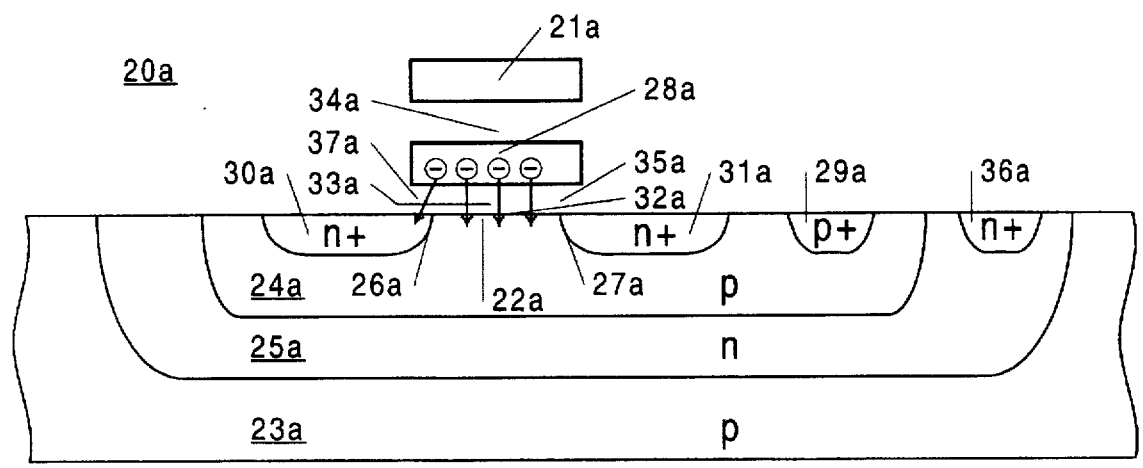
FIG. 3 is the same cross-sectional view as FIG. 2 using corresponding reference numerals and showing the effect of erasing according to the invention.

Referring to FIG. 3, which has an isolated p-well 24a surrounded by a deep n-well 25a formed in a p-substrate 23a, erasing is accomplished according to the invention by applying a negative bias voltage to the control gate 21a while at the same time applying a positive bias voltage to the source region 30a, the isolated p-well 24a (through the contact region 29a) and to the second semiconductor region 25a (through contact region 36a). Regions 24a and 25a are electrically shorted during erase. Drain region 31a is preferably left floating. The substrate 23a is grounded. The negative voltage on the control gate 21a is between about −1 V and −15 V, preferably between about −9 V and −13 V. The positive bias voltage on the source region 30a, the isolated p-well 24a and the second region 25a is less than about 15 V, preferably between about 3 V and 7 V . A specific example of the erase procedure of the invention used −11 V on the control gate 21a and 5 V on the source region 30a, the p-well 24a and the second region 25a.

Using this erase technique, the charge stored inside floating gate 28a tunnels through dielectric layer 33a and discharges into source region 30a and isolated p-well 24a. Since the same bias voltage is applied to both source region 30a and isolated p-well 24a, both regions are maintained at substantially equal electrical potential during erase. Accordingly, there is substantially no potential difference across the source junction 26a, and therefore there is substantially no BB tunneling current, eliminating the concomitant reliability problems described above during the prior art NGSE erase technique.

If desired, drain region 31a may be tied with the source region 30a, p-well 24a and second region 25a, all at substantially equal electrical potential. In this way, the charge on floating gate 28a also tunnels through the portion 35a of dielectric 33a between drain region 31a and floating gate 28a located at the overlap between drain region 31a and floating gate 28a.

The erase technique of the invention substantially eliminates the problems associated with the BB tunneling current of the prior art, since there is substantially no potential difference between the isolated p-well 24a and the source region 30a. Prior art NGSE schemes which do not have an isolated p-well biased at the source voltage, as in the subject invention, cannot avoid BB tunneling because of the potential gradient across the source junction 26. In the erase technique of the invention, any damage caused by tunneling electrons during erase is distributed along semiconductor-dielectric interface 32a, the portion of dielectric layer 33a above channel region 22a and the portion 37a of dielectric layer 33a at the overlap of the source region 30a and the floating gate 28a.

If a cell is erased to a predetermined V$_t$ (threshold voltage), the quantity of electrons removed from floating gate 28a is the same regardless of the erase scheme used. Assuming that all electrons are removed through a single point of oxide, all defects created would be concentrated at that point. If electrons are removed over a large area of oxide according to the invention, the resultant damage is relatively lower at each point of the oxide. Both the NGCSE process of the invention and the prior art NGCE procedure remove electrons through the oxide are above the channel region 22a, but the NGCSE process also removes electrons through the portion 37a of the dielectric layer 33a between floating gate 28a and source region 30a at their region of overlap. Since the NGCSE technique of the invention removes electrons through a larger area of oxide than NGCE does, the defect density created by NGCSE is less than that created by NGCE. Oxide damage created by NGCSE in the portion 37a of the dielectric layer 33a does not substantially adversely affect memory cell read current and transconductance.

Therefore the overall oxide damage and interface damage caused by NGCSE in the channel portion 22a of the dielectric layer 33a and along the semiconductor-dielectric interface 32a is less than that caused by the prior art NGCE technique in the same locations. Therefore NGCSE has less of an adverse impact upon memory cell read current and transconductance than NGCE.

Since numerous modifications and changes in the invention described above will readily occur to those skilled in the art, the invention is not limited to the exact construction and operation illustrated and described. For example, the preferred embodiment using an n-channel device may be changed to a p-channel device. In that case, the voltages all are reversed, negative voltages becoming positive and vice versa. However, the erase procedure of the invention remains the same. Hence, all suitable modifications and equivalents are intended to be within the scope of the invention, which shall be limited only as set forth in the following claims.

What is claimed is:

1. A method of electrically erasing an electrically erasable, programmable, read-only, non-volatile semiconductor memory device having a first semiconductor region of one conductivity type formed in a second semiconductor region of the opposite conductivity type, source and drain regions of the opposite conductivity type formed in the first semiconductor region and a gate including (1) a floating gate which retains charge overlying the first region and electrically isolated by a floating gate dielectric from the first region and from the source and drain regions and (2) a control gate atop the floating gate and electrically isolated therefrom by an insulating layer, comprising:

applying a first voltage of one polarity to the source, first and second regions; and simultaneously applying a second voltage of the opposite polarity to the control gate, whereby any charge on the floating gate tunnels through the floating gate dielectric into both the first region and the source region, thereby removing the charge retained by the floating gate.

2. The method of claim 1 wherein the first voltage is also applied to the drain region.

3. The method of claim 1 wherein the first region is p-type and the source and drain regions are n-type.

4. The method of claim 3 wherein the first voltage is positive and the second voltage is negative.

5. The method of claim 4 wherein the absolute value of the first voltage is smaller than the absolute value of the second voltage.

6. The method of claim 4 wherein the first voltage is a positive voltage less than about 15 volts and the second voltage is between about −1 and −15 volts.

7. The method of claim 4 wherein the first voltage is between about 3 and 7 volts and the second voltage is between about −9 and −13 volts.

8. The method of claim 1 wherein the first region is n-type and the source and drain regions are p-type.

9. The method of claim 8 wherein the first voltage is negative and the second voltage is positive.

10. The method of claim 9 wherein the absolute value of the first voltage is smaller than the absolute value of the second voltage.

11. The method of claim 9 wherein the first voltage is a negative voltage less than about −15 volts and the second voltage is between about 1 and 15 volts.

12. The method of claim 9 wherein the first voltage is between about −3 and −7 volts and the second voltage is between about 9 and 13 volts.

13. The method of claim 1 wherein the second region of semiconductor material is formed within a substrate of the one conductivity type.

14. The method of claim 13 wherein the substrate is grounded.

* * * * *